United States Patent [19]
Wilkes et al.

[11] Patent Number: 6,072,018
[45] Date of Patent: Jun. 6, 2000

[54] HIGH ABRASION RESISTANT COATING MATERIAL

[75] Inventors: Garth L. Wilkes, Blacksburg, Va.; Jianye Wen, Savoy, Ill.; Kurt Joseph Jordens, Blacksburg, Va.

[73] Assignee: Virginia Tech Intellectual Properties, Inc., Blacksburg, Va.

[21] Appl. No.: 08/882,101

[22] Filed: Jun. 25, 1997

Related U.S. Application Data

[60] Provisional application No. 60/027,408, Sep. 30, 1996.

[51] Int. Cl.$^7$ .......................... C08G 18/04; C08G 77/18
[52] U.S. Cl. ............................ 528/28; 528/29; 528/34; 528/39; 556/420; 556/421
[58] Field of Search .................... 428/28, 29, 34, 428/39; 524/91, 720; 556/421, 420

[56] References Cited

U.S. PATENT DOCUMENTS

| | | |
|---|---|---|
| 4,746,366 | 5/1988 | Phillipp et al. . |
| 4,929,278 | 5/1990 | Ashley et al. . |
| 5,316,695 | 5/1994 | Wilkes et al. . |
| 5,316,855 | 5/1994 | Wang et al. . |
| 5,360,834 | 11/1994 | Popall et al. ................ 522/36 |
| 5,371,261 | 12/1994 | Wang et al. . |
| 5,385,964 | 1/1995 | Basil et al. ................. 524/266 |
| 5,559,163 | 9/1996 | Dawson et al. ............. 522/75 |
| 5,849,465 | 12/1998 | Uchida et al. ............. 430/325 |
| 5,858,280 | 1/1999 | Zhang et al. ............... 501/12 |

FOREIGN PATENT DOCUMENTS

| | | |
|---|---|---|
| 63-48364 | 3/1988 | Japan . |
| 63-99268 | 4/1988 | Japan . |
| 63-152675 | 6/1988 | Japan . |
| 64-1769 | 1/1989 | Japan . |

OTHER PUBLICATIONS

Wen, J. et al., "Novel Abrasion Resistant Inorganic/Organic Coating Materials Based on Functionalized Diethylenetriamine, Glycerol and Diols," PMSE Preprints, vol. 73,1995, pp. 429–430.

Wen, J. et al., "Synthesis and Characterizaton of Abrasion Resistant Coating Materials Prepared by the Sol–Gel Approach: I. Coatings Based on Functionalized Aliphatic Diols and Diethylenetriamine," *Journal of Inorganic and Organometallic Polymers*, vol. 5, No. 4, 1995, pp. 343–375.

Wen, J. et al., "Abrasion Resistant Inorganic/Organic Coating Materials Prepared by the Sol–Gel Method," *Journal of Sol–Gel Science and Technology*, vol. 5, 1995, pp. 115–126.

Betrabet, C. et al., "Optically Abrasion Resistant Materials Using a Sol–gel Approach," Polymer Preprints, vol. 32, No. 2, 1992, p. 286.

*Primary Examiner*—Robert Dawson
*Assistant Examiner*—Kuo-Liang Peng
*Attorney, Agent, or Firm*—Oliff & Berridge, PLC

[57] ABSTRACT

An abrasion resistant coating for a substrate, particularly a transparent polymeric substrate or a metallic substrate, includes a cured inorganic/organic hybrid network material formed by a sol-gel co-condensation of at least one metal alkoxide and a silane-functionalized organic compound, wherein the silane-functionalized organic compound is a di- or triamine (such as, for example, diethylene triamine and 3,3'-iminobispropylamine), an aliphatic diol (such as, for example, ethylene glycol, 1,3-propanediol, 1,4-butanediol and 1,5-pentanediol), an aromatic diol (such as, for example, hydroquinone) or a triol (such as, for example, glycerol), functionalized by a silane-functional compound.

19 Claims, 2 Drawing Sheets

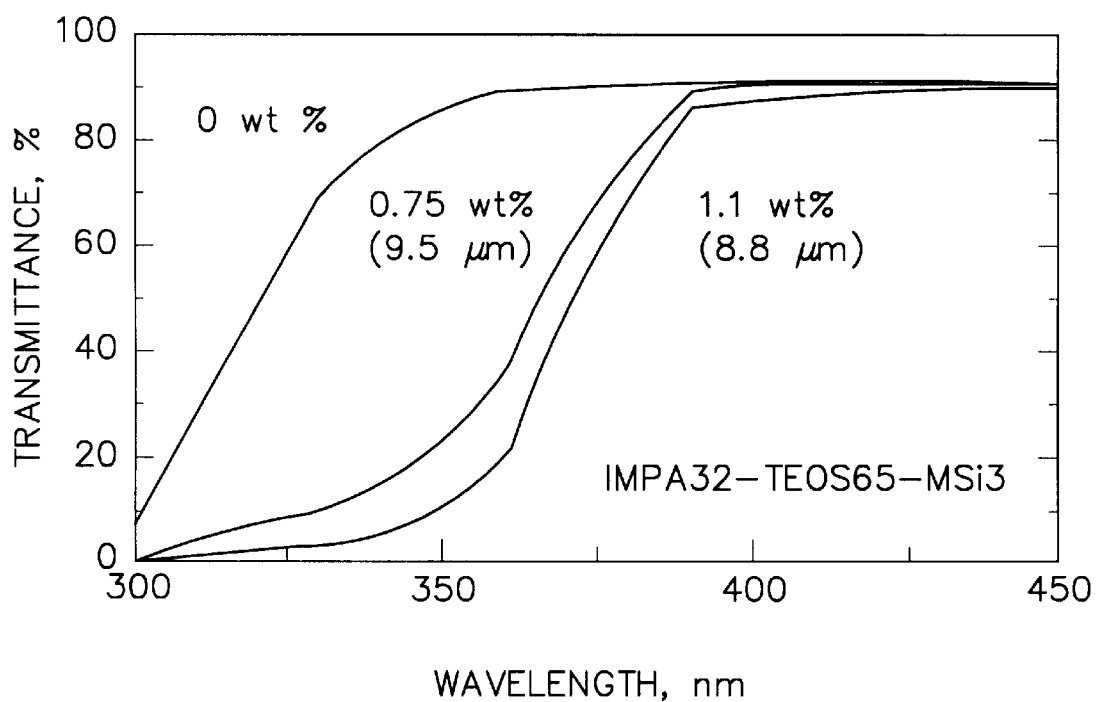

HIGH ABRASION RESISTANT COATING MATERIAL

This nonprovisional application claims the benefit of U.S. Provisional Application No. 60/027,408, filed Sep. 30, 1996.

BACKGROUND OF THE INVENTION

The present invention relates to improved abrasion resistant coatings, particularly for application to polymeric materials and metals. In particular, the present invention relates to inorganic/organic hybrid network coating materials produced by a sol-gel process, where the organic component is a silane-functionalized low molecular weight organic compound and the inorganic component is a metal alkoxide or a mixture of two or more metal alkoxides. The coatings of the present invention, in embodiments, provide improved optical abrasion resistance, improved hot-wet resistance, and improved UV resistance.

Transparent polymeric materials have been widely used in all aspects of daily life, and their use is steadily increasing. For example, transparent polymeric materials have found widespread use in windows for buildings and aircraft, glazing for automobiles, in household products such as glasses, and in optical lenses for a variety of applications. Unfortunately, the use of such transparent polymeric materials has been greatly limited and hindered by the non-abrasive resistant surfaces. In particular, the materials generally have a very low abrasion resistance, thereby making them susceptible to scratching, pitting, and dulling, thus reducing the transparency of the material.

Similarly, metals have always found widespread use in a wide variety of applications. In particular, aluminum has found widespread use for a variety of commercial and household items. However, as with the transparent polymeric materials, it is desired that the metal products have an increased abrasion resistance so that their physical and structural qualities and surface features can be maintained.

One solution to the non-abrasion resistance problem has been to coat the materials with a protective coating. Such a protective coating should have a higher abrasion resistance than the underlying substrate, thereby increasing the abrasion resistance of the material.

Various types of protective coating materials have been used to improve the abrasion resistance and hardness of materials such as transparent polymer material surfaces, such as polycarbonate resin. For example, Japan Kokai Tokkyo Koho JP 63 48,364 to Ishigaki et al. improved the scratch resistance of polymethylmethacrylate by utilizing silane compounds as coating materials. Japan Kokai Tokkyo Koho JP 63 152,675 to Komatsu et al. used a mixed inorganic composition of zirconate-silicate with a $SnO_2$ sol as an antistatic and scratch resistant coating material. Japan Kokai Tokkyo Koho JP 63 99,268 to Nishiuchi et al. also obtained an abrasion resistant and glossy coating material from a mixed system of alkali metal oxides. Japan Kokai Tokkyo Koho JP 64 01,769 to Yamada et al. used zirconium-containing organosiloxanes as hard coating materials which were based on a 1:1 molar ratio of $Zr(OBu)_4$ with $Si(MeO)_3H$ and ethylacetoacetate as the chelating agent. A pencil hardness value 4H was observed for the Yamada et al. system. Based on the same composition without $Zr(OBu)_4$, the pencil hardness value was reduced to only an HB value. The disclosure of these references describe coatings, which provide good adhesion of coatings on polymer. However, the disclosures are limited to inorganic systems with no functionalized organic reactants.

U.S. Pat. No. 4,929,278 to Ashley et al. also discloses various sol-gel derived coatings on plastics that are also inorganic in nature and do not contain functionalized organic reactants.

U.S. Pat. No. 4,746,366 to Philipp et al. describes the formation of scratch-resistant coatings that can be applied to plastic substrates, and which are formed by the hydrolytic polycondensation of at least one titanium or zirconium compound (such as tetraethyl titanate or tetrapropyl zirconate) and at least one organofunctional silane. In these systems, the organic moiety has a single silane functionality at one end that is capable of hydrolytic polycondensation with the titanium or zirconium compound.

U.S. Pat. No. 5,316,855 to Wilkes et al. also discloses a series of new high abrasion resistance coating materials. The materials are prepared utilizing organic/inorganic hybrid materials formed by co-condensing a metal alkoxide sol (e.g., silicon, aluminum, titanium, or zirconium metal alkoxide sol) with one or more bis(trialkoxysilane-containing) organic components or related functionalized species. The hybrid materials show optical clarity and improve the abrasion resistance of polymer substrates when applied as coatings and cured on the substrates. The coatings are applied to the substrate material, and are then dried and cured over a period of several hours.

An additional problem that must be addressed with respect to the abrasion resistant coatings is the susceptibility of the coatings to water damage. In particular, hot or boiling water can dramatically weaken the coating properties. The degradation caused by water results from the presence of water at the substrate/coating interface, which may weaken or completely break the coating/substrate bonding. The result can be delamination of the coating film from the substrate.

A further problem with conventional abrasion resistant coatings is that they are susceptible to degradation from exposure to ultraviolet radiation. In particular, most commercial organic polymers undergo chemical changes upon exposure to UV light (290 to 400 nm) because they possess chromophoric groups capable of absorbing UV light. This absorption of UV light by the polymers results in noticeable physical and chemical changes. Incorporation of a UV stabilizer into the coating system protects both the coating and the substrate from UV radiation. This leads to durability of the product.

However, there remains a need for improved abrasion resistant coatings for transparent polymeric material and metal surfaces. In particular, the need continues to exist for coatings that not only improve the 5 abrasion resistance of the underlying substrate, but that can be more easily and quickly applied in a commercial environment. Moreover, the need continues to exist for material coatings that can withstand more stringent conditions, such as conditions known as "hot-wet" conditions in which the coating is exposed to water at elevated temperatures.

SUMMARY OF THE INVENTION

The present invention overcomes the above problems, and provides new coating materials with improved optical abrasion resistance and that retain their improved properties against environmental degradation, such as after exposure to hot-wet conditions and UV exposure.

In particular, the present invention is directed to an abrasion resistant coating for a substrate, comprising a coating of a cured inorganic/organic hybrid network material formed by a sol-gel co-condensation (i.e., hydrolysis and condensation reaction) of at least one metal alkoxide and a silane-functionalized organic compound, wherein said silane-functionalized organic compound originated from a di- or triamine (such as, for example, diethylene triamine and 3,3'-iminobispropylamine), an aliphatic diol (such as, for example, ethylene glycol, 1,3-propanediol, 1,4-butanediol and 1,5-pentanediol), an aromatic diol (such as, for example, hydroquinone), a triol (such as, for example, glycerol) or the like, functionalized by a silane-functional compound.

In embodiments, the present invention also provides coatings for transparent polymeric materials and metals that are less susceptible to degradation as a result of exposure to ultraviolet radiation. In particular, the coatings of the present invention protect the underlying polymeric and metal material from excessive UV exposure, and also themselves possess longer UV resistance.

BRIEF DESCRIPTION OF THE FIGURES

FIG. 3 shows the UV spectra of coatings containing a UV stabilizer versus a coating containing no UV stabilizer.

DETAILED DESCRIPTION OF PREFERRED EMBODIMENTS

Figure 1:
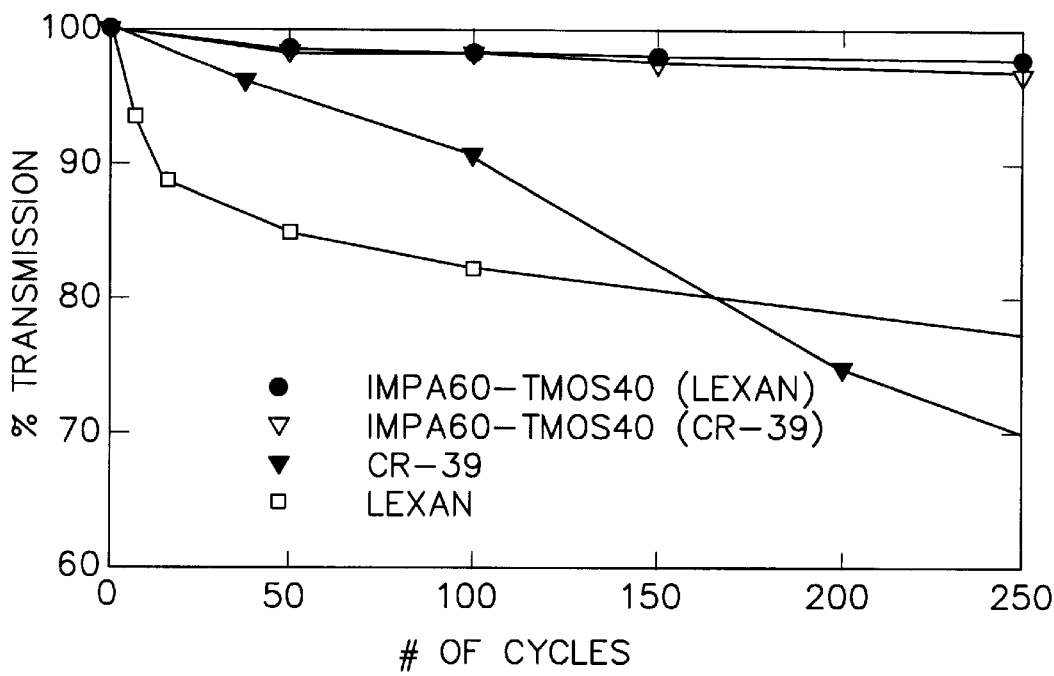
FIG. 1 shows the relationship between the number of cycles of an abrasion test versus the % of light transmission through an abraded substrate.

The high abrasion resistant coating material of the present invention generally comprises an inorganic/organic hybrid network produced by a sol-gel process, where the organic component is a silane-functionalized low molecular weight organic compound and the inorganic component is a metal alkoxide or a mixture of two or more metal alkoxides.

The abrasion resistant coating materials of the present invention are suitable for coating a wide variety of substrate materials, to provide increased abrasion resistance, particularly optical abrasion resistance, to the substrate. For example, suitable substrates include, but are not limited to, polymeric materials, metals, and the like. Suitable polymeric materials include, but are not limited to, poly(methyl methacrylate); polycarbonates such as bisphenol-A polycarbonate and diallyl diglycol carbonate resin; polyimides such as poly(ether imide); mixtures thereof; and the like. Suitable metal substrates include, but are not limited to, aluminum, copper, stainless steel, brass, steel, alloys thereof, and the like.

The substrate is coated with an abrasion resistant coating solution, generally comprising an inorganic/organic hybrid network produced by a sol-gel process, where the organic component is a silane-functionalized organic compound, particularly a low molecular weight organic compound, and the inorganic component is a metal alkoxide or a mixture of two or more metal alkoxides.

In embodiments of the present invention, the organic component of the inorganic/organic hybrid network is a silane-functionalized organic compound, such as a low molecular weight organic compound. In particular, in embodiments, the low molecular weight organic compound of the organic component is a di- or triamine (such as, for example, diethylene triamine and 3,3'-iminobispropylamine), an aliphatic diol (such as, for example, ethylene glycol, 1,3-propanediol, 1,4-butanediol and 1,5-pentanediol), an aromatic diol (such as, for example, hydroquinone), a triol (such as, for example, glycerol) and the like. Preferred are diethylene triamine and 3,3'-iminobispropylamine.

The low molecular weight organic compound is functionalized by a suitable silane-functional compound. In embodiments, the silane compound is preferably a di- or trialkoxysilane species containing a reactive or functional group such as isocyanate or an amino moiety. An example of such a compound is an isocyanate functionalized di- or trialkoxysilane, such as 3-isocyanatopropyltriethoxysilane. The silane compound should preferably contain one reactive isocyanate group and one or more di- or trialkoxysilane groups. However, 3-isocyanatopropyltriethoxysilane is particularly preferred in embodiments of the present invention.

In embodiments of the present invention, the inorganic component of the inorganic/organic hybrid network is a metal alkoxide, or a mixture of two or more metal alkoxides. In embodiments, the metal alkoxide mixture preferably comprises tetramethoxysilane (TMOS), tetraethoxysilane (TEOS), aluminum-based alkoxides (such as, for example, aluminum tri-sec butoxide), zirconium-based alkoxides (such as, for example, zirconium (IV) n-propoxide), titanium-based alkoxides (such as, for example, titanium (IV) isopropoxide and titanium (IV) butoxide), and the like.

In embodiments of the present invention, the content ratio of the organic component to the inorganic component in the inorganic/organic hybrid network can be suitably selected based on the desired physical and chemical properties of the resultant abrasion resistant coating. Preferably, the organic component (silane-functionalized organic compound) is present in an amount of from about 20 to about 80 weight percent, and more preferably from about 30 to about 60 weight percent, based on the weight of reactants. Preferably, the inorganic component (one or more metal alkoxides) is present in an amount of from about 80 to about 20 weight percent, and more preferably from about 70 to about 40 weight percent, based on the weight of reactants.

According to the present invention, the inorganic/organic hybrid network is formed by a two-step process. In the first step, a silane-functionalized low molecular weight organic compound is prepared. In the second step, the silane-functionalized low molecular weight organic compound is reacted with one or more metal alkoxides to form the hybrid network. This reaction scheme is described in further detail in J. Wen, K. Jordens and G. L. Wilkes, "Hybrid Organic/Inorganic Coatings for Abrasion Resistance on Plastic and Metal Substrates," presented at the 1996 meeting of The Materials Research Society in San Francisco, and the entire disclosure of which is incorporated herein by reference. Of course, the first step of the preparation process can be bypassed simply by providing a suitable silane-functionalized organic compound to be reacted with the metal alkoxide.

In the first step, the silane-functional compound is reacted with the low molecular weight organic compound. For example, a triethoxysilane-functionalized organic compound can be formed by mixing 3-isocyanatopropyltriethoxysilane with an organic compound such as a di- or triamine (such as, for example, diethylene triamine and 3,3'-iminobispropylamine), an aliphatic diol (such as, for example, ethylene glycol, 1,3-propanediol, 1,4-butanediol and 1,5-pentanediol), an aromatic diol (such as, for example, hydroquinone), glycerol, or the like. In this reaction, the amino or hydroxyl groups in the organic compounds react with the isocyanate group in 3-isocyanatopropyltriethoxysilane. This reaction is described in further detail, for example, in J. Wen and G. L. Wilkes, *Journal of Inorganic and Organometallic Polymers*, Vol. 5, p 343 (1995), and in J. Wen, V. J. Vasudevan and G. L. Wilkes, *J. Sol-Gel Science & Technology*, Vol. 5, p 115 (1995), the entire disclosures of which are incorporated herein by reference. The reaction may be considered to be complete when the characteristic absorption band of the isocyanate functionality, at about 2273 $cm^{-1}$ as measured by FT-IR, disappears.

In the second step, the silane-functionalized organic compound is reacted with one or more metal alkoxides to form the hybrid network. For example, the hybrid network can be formed by the hydrolysis and condensation reactions of the functionalized organics and the metal alkoxides. During this procedure, siloxane bonds are formed by the condensation of hydroxyl as well as alkoxy groups, which leads to the formation of an inorganic backbone incorporated with organics.

In embodiments, it is preferred that the second step of the formation process, i.e., the formation of the hybrid network itself, be conducted with the addition of a small amount of a catalyst such as a strong acid. For example, it has been found that the addition of an amount of 0.5 to 1 N hydrochloric acid to the reaction solution assists the hydrolysis and condensation reactions. However, any other acid or similar catalytic material may be added to the reaction medium for this purpose. For example, in embodiments of the present invention, the catalytic compound can be any other suitable organic or inorganic acid, such as glacial acetic acid, or can be a polymeric acid catalyst, such as poly(styrene)sulfonic acid. Use of such polymeric acid catalysts is described in, for example, U.S. Pat. No. 5,316,695 to Wilkes et al., the entire disclosure of which is incorporated herein by reference.

In embodiments of the present invention, it may also be desirable to incorporate ligands in the second step of the network formation process, i.e., during the reaction of the silane-functionalized organic compound with one or more metal alkoxides to form the hybrid network. The use of coordinating ligands is particularly preferred in embodiments where non-silicate metal alkoxides are utilized, such as aluminum- and zirconium-based metal alkoxides. In such embodiments, if a coordinating ligand is not used, it is possible that the reaction of the non-silicate metal alkoxides will lead to precipitation of metal oxide particles, which may cause undesirable results such as leading to scattering of light, and the like. Thus, coordinating ligands may be used to slow down the reaction rate of the metal alkoxides to avoid these problems.

In embodiments, the ligands may be incorporated in any suitable and effective amount, based on the particular metal alkoxides being used. For example, inclusion of about 0.5 mole ligand per mole of metal alkoxide yields adequate results. An examples of a suitable ligand is ethylacetoacetate, but other suitable ligands will be apparent to one of ordinary skill in the art based on the present disclosure.

Once formed, the hybrid network compound can be coated upon the substrate by any suitable means to provide a desired coating thickness. For example, suitable coating processes include, but are not limited to, dip coating, spin coating, draw bar coating, roll coating, solvent coating, extrusion coating, spray coating, and the like. Of these, spin coating and dip coating are preferred.

Formation of such inorganic/organic hybrid materials is also described, for example, in U.S. Pat. No. 5,316,855 to Wilkes et al., the entire disclosure of which is incorporated herein by reference.

In embodiments, it is preferred that the uncoated substrate be cleaned prior to the coating process, so as to avoid the incorporation of impurities into the coating layer and at the substrate/coating interface. For example, in the case of metal substrates, it is preferred that the substrate surface be first cleaned of dust and oils with, for example, 2-propanol or acetone. Polished metal substrate surfaces can also be used, as well as more rough, such as sanded, surfaces. Similarly, in the case of polymeric substrate materials, it is preferred that the surface be cleaned with a degreasing liquid such as 2-propanol (a non-solvent for the polymer).

In addition, in embodiments, an adhesion-promoting substance may be applied to the surface of the uncoated substrate to promote better adhesion between the substrate and the abrasion resistant coating material. For example, in embodiments, a primer such as 3-aminopropyltriethoxysilane can be applied to the surface to be coated. However, any other suitable materials can also be used. In addition, if the coating solution is to be placed on a polymeric material substrate, the substrate can be similarly pre-treated by a plasma pretreatment process (e.g., oxygen or another suitable plasma, 50 W to 100 W at times of from several seconds up to about 30 minutes) to enhance the adhesion of the coating.

In embodiments, the thickness of the coating can be any suitable amount, and will generally depend upon the specific type of material being coated, the substrate, the desired use of the coated substrate, and other product and use specifications. However, suitable thicknesses of from about 1 to about 20 microns can be obtained. Preferably, the thickness is from about 2 to about 5 microns for high spin rate application, and from about 8 to about 12 microns for lower spin rate application processes.

Once the coating solution is applied to the surface of the substrate, the solution must be cured to provide the final abrasion resistant coating. In embodiments, the coated substrate can be directly processed through a suitable curing step without any intermediate drying operations. However, in embodiments, it is preferred that the coated substrate be permitted to set in a preferably dust-free environment until the coating is non-tack. Once non-tack has been achieved, the coated substrate can then be processed through a suitable curing step to cure the coating. By allowing a non-tack coating to be first obtained, the curing step can be made more efficient because a large stack of coated substrates can be simultaneously processed, rather than being processed individually. That is, because the coating is non-tack, the coated substrates can be stacked or rolled together, even though they touch each other, without adversely affecting the properties of the resultant abrasion resistant coating.

In embodiments, the first curing step is conducted at a suitable temperature of from about 100° C. to about 200° C., preferably from about 120° C. to about 185° C. However, the curing temperature may depend upon the composition of the coating solution and the substrate. For example, it is preferred, but not required, that coatings on polymeric substrates be cured below the glass transition temperature of the substrate to avoid warping. It is also preferable in the case of any substrate that the curing temperature remain below the degradation temperature of the coating reactants. For example, in the case of bisphenol-A polycarbonate substrates the cure temperature is preferred to be from about 120° C. to about 130° C., and for metal substrates it is preferred to be from about 175° C. to about 185° C. Curing is also conducted for a sufficient amount of time to provide the abrasion resistant coating. Suitable curing times of from about 5 minutes to about 12 hours may be sufficient. Preferably, the curing time is from about 2 to about 12 hours for polymeric material substrates, and from about 15 minutes to about 2 hours for metallic substrates.

If desired, the curing of the coated, non-conducting substrates may be accelerated using microwave treatment. For example, such microwave curing is described in U.S. Pat. No. 5,371,261 to Wang et al., the entire disclosure of which is incorporated herein by reference.

In other embodiments of the present invention, an effective amount of an ultra-violet (UV) stabilizer or blocking component may also be incorporated into the coating solution to provide UV resistance to the coating and to protect the coating and substrate from UV rays. Any suitable UV stabilizer may be used for this purpose, and such UV stabilizers are generally known and readily available. However, in embodiments, it is preferred that the UV stabilizer be of the hydroxyphenylbenzotriazole class, such as 2-(2'-hydroxy-5'-methacryloxyethyl-phenyl)-2H-benzotriazole of the following formula:

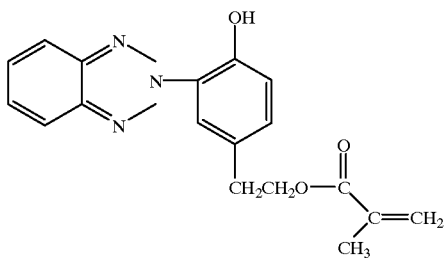

Such a compound is available, for example, as NORBLOC™ 7966 from Noramco, Inc.

Although acceptable results may be obtained simply by mixing the UV stabilizer into the solution mixture, improved results are obtained according to the present invention by covalently bonding the UV stabilizer into the coating composition. This approach not only provides increased UV resistance while maintaining abrasion resistance, but also reduces such possible problems as incompatibility of the UV stabilizer with the coating, migration of the UV stabilizer within the coating, volatility of the UV stabilizer, and solution extraction.

When incorporated into the coating solution, the UV stabilizer is preferably dissolved in solution prior to addition of the silane-functionalized organic compounds. Otherwise, preparation of the coating solution is as described above.

When a UV stabilizer compound is incorporated into the coating solution, the UV stabilizer can be incorporated in any suitable amount to provide the UV stabilization and protection functions. Preferably, the UV stabilizer is incorporated in an amount of from about 0.1 to about 3.0 weight percent, preferably from about 0.5 to about 2.0 weight percent, and more preferably from about 0.75 to about 1.1 weight percent, based on the weight of the starting reactants.

The invention will now be described in detail with reference to examples of specific preferred embodiments thereof. All parts and percentages are by weight unless otherwise indicated.

EXAMPLES

Example 1

This Example shows the preparation of a triethoxysilane-functionalized diethylene triamine, which is subsequently used to form a coating composition.

First, 1 mole of diethylene triamine is mixed with 6.2 moles 2-propanol. The mixture is immediately placed in an ice bath to prevent side reactions with water contained in the mixture. To the diethylene triamine/propanol mixture is dropwise added 3.15 moles isocyanatopropyltriethoxysilane. Reaction of the mixture is allowed to proceed to completion, with the mixture maintained in the ice bath, which takes about eight hours. The mixture is stirred continually during the reaction.

Example 2

This Example describes the preparation of an abrasion resistant coating using the triethoxysilane-functionalized diethylene triamine produced in Example 1. The coating is applied to an aluminum substrate.

First, 100 parts by weight of the triethoxysilane-functionalized diethylene triamine solution produced in Example 1 is mixed with 50 parts by weight of 2-propanol. While stirring, 70 parts by weight tetramethoxysilane is added to the triethoxysilane-functionalized diethylene triamine/2-propanol mixture. Next, under brisk stirring of the mixture, 12.5 parts by weight 0.5 M hydrochloric acid is slowly and dropwise added to the mixture. The resultant mixture is then stirred for an additional about 30 seconds.

Once the mixture has been formed, it is spin coated onto an aluminum substrate. The coated aluminum substrate is set aside, preferably in a dust-free environment, until the coating reaches a non-tack state, which takes about five minutes. The coated substrate is then thermally cured in an oven set at 60° C. for five minutes, followed by an oven set at 185° C. for ten minutes.

In this and the following examples, the term "parts by weight" refers to the total parts by weight of the entire starting composition, i.e., the term "parts by weight" maybe replaced by "grams."

Example 3

This Example describes the preparation of an abrasion resistant coating, similar to Example 2, using the triethoxysilane-functionalized diethylene triamine produced in Example 1, except that this Example provides UV resistance in addition to abrasion resistance. The coating is applied to an aluminum substrate.

First, 3 parts by weight benzoyl peroxide is dissolved in 997 parts by weight acetone. This mixture is then set aside for later use. In a separate vessel is combined 100 parts by weight 2-propanol and 3 parts by weight NORBLOC™ 7966 (available from Noramco, Inc.). To this mixture is added 12 parts by weight 3-(trimethoxysilyl)propyl methacrylate, 150 parts by weight tetramethoxysilane, and 193 parts by weight of the triethoxysilane-functionalized diethylene triamine produced in Example 1. The mixture is stirred for about five minutes to ensure that the NORBLOC™ 7966 is fully dissolved. To this mixture is then added 50 parts by weight of the benzoyl peroxide/acetone mixture prepared previously. Next is added 20 parts by weight 0.5 M hydrochloric acid. The resultant mixture is then stirred for about one minute prior to coating.

Once the mixture has been formed, it is coated on an aluminum substrate using the same procedure as in Example 2. The coated substrate is set aside, preferably in a dust-free environment, until the coating reaches a non-tack state, which takes about five minutes. The coated substrate is then thermally cured following the same procedure as in Example 2.

Example 4

This Example demonstrates the change in abrasion resistance provided by the present invention. In this Example, two different substrate surfaces are coated with an abrasion resistant coating according to the present invention, and their abrasion resistance is compared to similar uncoated substrates.

The two substrates used are Lexan™, a bisphenol-A polycarbonate resin sheet available from the General Electric Company, and CR-39, a diallyl diglycol carbonate resin available from Atlantic Plastics Company. In this Example, the substrates to be coated are cut into sheets measuring 3.5 inches square by 1/16 inch thick.

The specific samples tested are:

A=Lexan coated with a solution comprised of 100 parts by weight silane functionalized 3,3'-iminobispropylamine solution prepared according to the procedure outlined in Example 1, 50 parts 2-propanol, 46.7 parts tetramethoxysilane, and 9.5 parts 0.5 M hydrochloric acid. This coating solution is prepared according to the procedure outlined in Example 2.

B=CR-39 coated with a solution comprised of 100 parts by weight silane functionalized 3,3'-iminobispropylamine solution prepared according to the procedure outlined in Example 1, 50 parts 2-propanol, 46.7 parts tetramethoxysilane, and 9.5 parts 0.5 M hydrochloric acid. This coating solution is prepared according to the procedure outlined in Example 2.

C=Uncoated CR-39.

D=Uncoated Lexan.

The coating solution is prepared generally according to the procedure outlined in Example 2, above, and the substrates are first treated with a suitable primer or plasma, for example, a solution comprised of 0.5 wt % 3-aminopropyltriethoxysilane in 2-propanol and then coated according to the procedure of Example 2.

Each of the Samples A–D are tested for optical abrasion resistance using a Taber Abraser with CS-10 wheels and 500 g loading on each wheel. A measure of abrasion for samples with a transparent substrate is obtained by measuring the intensity of transmitted light through the abraded regions. For metal substrates, abrasion performance is assessed visually and illustrated by photography. A monochromatic light source of 420 nm on a Shimadzu-9000 Flyscan spectrometer is used to measure the transmittance through the abraded substrates. This testing is further described in: C. Betrabet and G. L. Wilkes, *Polymer Preprints,* Vol. 32, No. 2, p. 286 (1992) J. Wen and G. L. Wilkes, *Journal of Inorganic and Organometallic Polymers,* Vol. 5, p 343 (1995); J. Wen, V. J. Vasudevan and G. L. Wilkes, *J. Sol-Gel Science & Technology,* Vol. 5, p 115 (1995); and J. Wen and G. L. Wilkes, *PMSE Preprints,* Vol. 73, p 429 (1995), the entire disclosures of which are incorporated herein by reference.

Results of the abrasion resistance testing is shown in FIG. 1. FIG. 1 shows the relationship between the number of cycles of the abrasion test versus the % of light transmission through the abraded substrate. As shown in FIG. 1, the substrates coated according to the present invention (Samples A and B) demonstrate increased abrasion resistance as compared to uncoated substrates (Samples C and D).

FIG. 1 also demonstrates that the abrasion resistance of uncoated bisphenol-A polycarbonate (Lexan, Sample D) drops quickly at lower number of cycles, but levels off at higher number of cycles. On the other hand, the abrasion resistance of uncoated CR-39 (Sample C), which is a more highly scratch-resistant crosslinked polymer and has been widely used for eyeglass lenses, decreases at a much slower rate in the beginning, although this decrease continues. In contrast, the substrates coated according to the present invention (Samples A and B) demonstrate superior abrasion resistance that remains at a substantially constant level.

Example 5

This Example demonstrates the change in abrasion resistance provided by the present invention as compared to commercially available hard coat materials. In this Example, surfaces of a substrate material are coated with abrasion resistant coatings according to the present invention, and with a commercially available abrasion resistant coating Lexan MR5™. The abrasion resistance is then measured.

Three samples are prepared for this Example, each using the same substrate material. The three samples are:

E=solution comprised of 100 parts by weight silane functionalized 3,3'-iminobispropylamine solution prepared according to the procedure outlined in Example 1, 50 parts 2-propanol, 130 parts tetraethoxysilane, and 15.9 parts 0.5 M hydrochloric acid. This coating solution is prepared according to the procedure outlined in Example 3.

F=solution comprised of 100 parts by weight silane functionalized 3,3'-iminobispropylamine solution prepared according to the procedure outlined in Example 1, 50 parts 2-propanol, 142.2 parts tetraethoxysilane, 6.56 parts 3-(triethoxysilyl)propyl methacrylate, 2.4 parts NORBLOC™ 7966 and 17.4 parts 0.5 M hydrochloric acid. This coating solution is prepared according to the procedure outlined in Example 3.

G=solution of Lexan MR5™.

The coating solution for Sample E is prepared generally according to the procedure outlined in Example 2, above, and the coating solution for Sample F is prepared generally according to the procedure outlined in Example 3, above. Coating of the substrates is as described above.

Each of the Samples E–G are tested for optical abrasion resistance using the same procedure as described above in Example 4.

Figure 2:
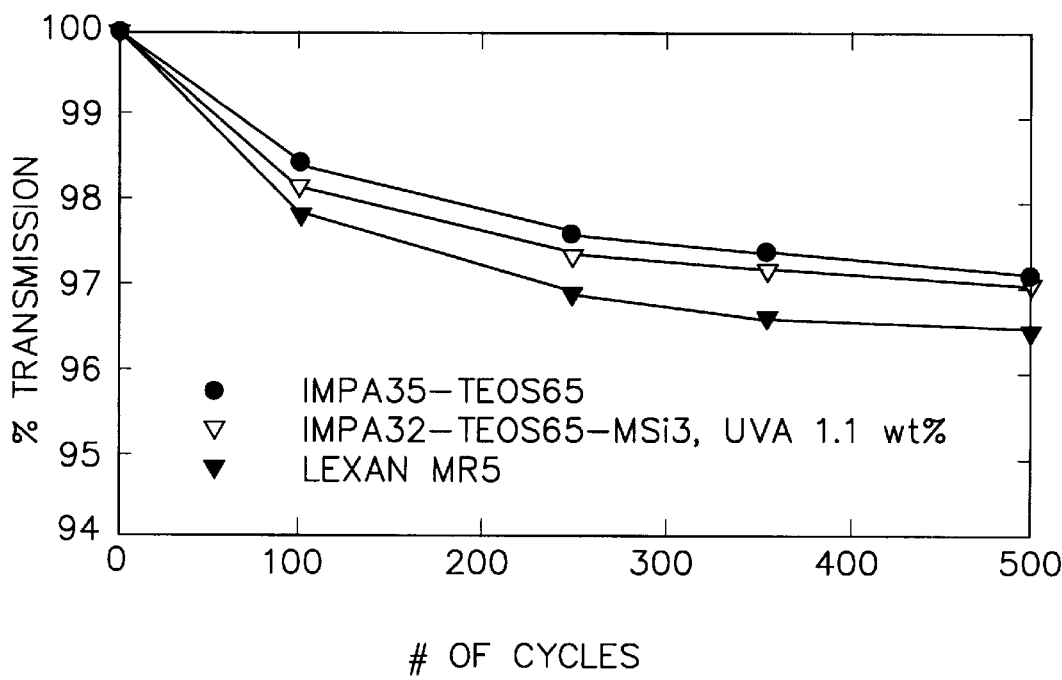
FIG. 2 shows the relationship between the number of cycles of an abrasion test versus the % of light transmission through an abraded substrate.

Results of the abrasion resistance testing are shown in FIG. 2. FIG. 2 shows the relationship between the number of cycles of the abrasion test versus the % of light transmission through the abraded substrate. As shown in FIG. 2, the substrates coated according to the present invention (Samples E and F) demonstrate increased abrasion resistance as compared to the substrate coated with Lexan MR5™ (Sample G).

Example 6

This Example demonstrates the change in UV resistance provided by the present invention in embodiments incorporating a UV stabilizer in the coating composition, as compared to a coating composition not including such a UV stabilizer. In this Example, surfaces of a substrate material are coated with abrasion resistant coatings according to the present invention according to the procedures described in Example 5, above.

Three samples are prepared for this Example, each using the same substrate material. The three samples are:

F=solution comprised of 100 parts by weight silane functionalized 3,3'-iminobispropylamine solution prepared according to the procedure outlined in Example 1, 50 parts 2-propanol, 142.2 parts tetraethoxysilane, 6.56 parts 3-(triethoxysilyl)propyl methacrylate, 2.4 parts NORBLOC™ 7966 and 17.4 parts 0.5 M hydrochloric acid. This Sample is the same as Sample F in Example 5.

H=solution comprised of 100 parts by weight silane functionalized 3,3'-iminobispropylamine solution prepared according to the procedure outlined in Example 1, 50 parts 2-propanol, 142.2 parts tetraethoxysilane, 6.56 parts 3-(triethoxysilyl)propyl methacrylate, 1.64 parts NORBLOC™ 7966 and 17.4 parts 0.5 M hydrochloric acid.

I=solution comprised of 100 parts by weight silane functionalized 3,3'-iminobispropylamine solution prepared according to the procedure outlined in Example 1, 50 parts 2-propanol, 142.2 parts tetraethoxysilane, 6.56 parts 3-(triethoxysilyl)propyl methacrylate and 17.4 parts 0.5 M hydrochloric acid. The solution contained no NORBLOC™ 7966.

The coating solutions for the Samples are prepared and coated as described in Example 5.

Each of the Samples F, H and I are analyzed for their respective UV absorption spectra of the coatings, using a Hitachi U-2000 Spectrophotometer.

Results of the UV testing are shown in FIG. 3. FIG. 3 shows the UV spectra of coatings containing a UV stabilizer versus a coating containing no UV stabilizer. As shown in FIG. 3, the substrates using a coating including a UV stabilizer (Samples F and H) are capable of absorbing long wavelength UV near 390 nm. The coated substrates still possess, however, the high degree of abrasion resistance as demonstrated in Example 5.

Example 7

This Example describes the preparation of an abrasion resistant coating similar to Example 2, which maintains its abrasion resistant character after exposure to hot-wet conditions (boiling water for 1 hour). It utilizes the triethoxysilane functionalized diethylene triamine solution described in Example 1 and is applied to polymeric substrates (e.g. polycarbonate).

First, 40 parts 2-propanol are combined with 15.6 parts of 1M aqueous hydrochloric acid and the mixture is set aside for later use. In a separate vessel, 40 parts 2-propanol are combined with 10 parts ethylacetoacetate and 35 parts aluminum tri-sec butoxide. After about 3 minutes of stirring, to this solution is added 100 parts silane functionalized diethylene triamine solution and 70 parts tetramethoxysilane. To this mixture, under brisk stirring, is added the entire first 2-propanol and hydrochloric acid mixture, dropwise, over the course of about 1 minute.

Once this coating solution is formed it is allowed to stir for about 2 minutes before being spin coated onto a clean polycarbonate substrate. The coated substrate is then set aside, preferably in a dust free environment, until it reaches a non-tack state, which takes about 10 minutes. The coated substrate is then transferred to a 60° C. oven for about 10 minutes, after which it is slowly heated (about 2°/min) to 130° C. where it is allowed to cure for 10 hours.

Example 8

This Example describes the preparation of an abrasion resistant coating similar to Example 2, which possesses good hot-wet resistance. It utilizes the triethoxysilane functionalized diethylene triamine solution described in Example 1 and is applied to aluminum substrates.

First, 100 parts of the silane functionalized diethylene triamine solution is combined with 50 parts 2-propanol. To this solution is added 70 parts tetramethoxysilane. With this mixture then under brisk stirring, 12.5 parts of 0.5 M hydrochloric acid is added slowly and dropwise.

Once this coating solution is formed it is allowed to stir for about 1 minute before being spin coated onto a clean aluminum substrate. The coated substrate is then set aside, preferably in a dust free environment, until it reaches a non-tack state, which takes about 5 minutes. The coated substrate is then transferred to a 60° C. oven for about 10 minutes, after which it is heated (about 5°/min) to 175° C. where it is allowed to cure for 20 minutes.

What is claimed is:

1. An abrasion resistant coating for a substrate, comprising a coating of a cured inorganic/organic hybrid network material formed by a sol-gel co-condensation of at least one metal alkoxide and a silane-functionalized organic compound, wherein said silane-functionalized organic compound is a compound selected from the group consisting of an isocyanate, a diamine, a triamine, an aliphatic diol, an aromatic diol and a triol, functionalized by a silane-functional compound; and wherein said at least one metal alkoxide is selected from the group consisting of tetramethoxysilane and tetraethoxysilane.

2. The abrasion resistant coating according to claim 1, wherein said silane-functional compound is a mono- or di-functional silane compound.

3. The abrasion resistant coating according to claim 2, wherein said silane-functional compound is a di- or trialkoxysilane containing a reactive or functional group.

4. The abrasion resistant coating according to claim 3, wherein said reactive or functional group is an isocyanate moiety or an amino moiety.

5. The abrasion resistant coating according to claim 1, wherein said silane-functional compound is isocyanatopropyltriethoxysilane.

6. The abrasion resistant coating according to claim 1, wherein said silane-functionalized organic compound is present in an amount of from about 20 to about 80 weight percent and said metal alkoxide is present in an amount of from about 80 to about 20 weight percent, based on a weight of reactants.

7. The abrasion resistant coating according to claim 1, wherein said silane-functionalized organic compound is present in an amount of from about 30 to about 60 weight percent and said metal alkoxide is present in an amount of from about 70 to about 40 weight percent, based on a weight of reactants.

8. The abrasion resistant coating according to claim 1, further comprising a UV stabilizer.

9. The abrasion resistant coating according to claim 8, wherein said UV stabilizer is a hydroxyphenylbenzotriazole compound.

10. The abrasion resistant coating according to claim 9, wherein said UV stabilizer is 2-(2'-hydroxy-5'-methacrylyloxyethyl-phenyl)-2H-benzotriazole, having the formula:

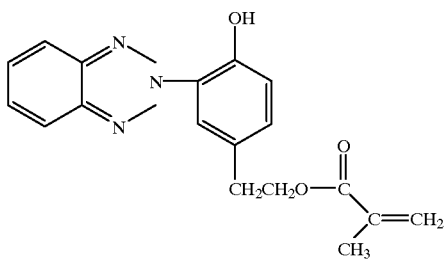

11. The abrasion resistant coating according to claim 8, wherein said UV stabilizer is present in an amount of from about 0.1 to about 3.0 weight percent based on a weight of reactants.

12. The abrasion resistant coating according to claim 1, wherein said substrate is selected from the group consisting of polymeric materials and metals.

13. The abrasion resistant coating according to claim 1, wherein said substrate is a transparent polymeric material.

14. The abrasion resistant coating according to claim 1, wherein said coating is prepared by a process comprising reacting said silane-functionalized organic compound in a sol-gel process with said at least one metal alkoxide to form the hybrid network.

15. The abrasion resistant coating according to claim 14, wherein said silane-functionalized organic compound is prepared by reacting said silane-functional compound with an organic compound.

16. The abrasion resistant coating according to claim 14, wherein said sol-gel process is conducted in the presence of a coordinating ligand.

17. The abrasion resistant coating according to claim 16, wherein said coordinating ligand is ethylacetoacetate.

18. The abrasion resistant coating according to claim 1, wherein said silane-functionalized organic compound is a compound selected from the group consisting of diethylene triamine, 3,3'-iminobispropylamine, ethylene glycol, 1,3-propanediol, 1,4-butanediol, 1,5-pentanediol, hydroquinone and glycerol, functionalized by a silane-functional compound.

19. The abrasion resistant coating according to claim 1, wherein said silane-functionalized organic compound is diethylene triamine or 3,3'-iminobispropylamine, functionalized by a silane-functional compound.

* * * * *

UNITED STATES PATENT AND TRADEMARK OFFICE
CERTIFICATE OF CORRECTION

PATENT NO. : 6,072,018
DATED : June 6, 2000
INVENTOR(S) : Garth L. WILKES, Jianye WEN; and Kurt Joseph JORDENS It is certified that error appears in the above-indentified patent and that said Letters Patent is hereby corrected as shown below:

Column 2, line 50, delete "5".

Signed and Sealed this

First Day of May, 2001

Attest:

NICHOLAS P. GODICI

*Attesting Officer*    *Acting Director of the United States Patent and Trademark Office*